United States Patent [19]
Hirai

[11] Patent Number: 6,130,485
[45] Date of Patent: Oct. 10, 2000

[54] SEMICONDUCTOR INTEGRATED CIRCUIT AND LAYOUT METHOD THEREOF

[75] Inventor: Masahiko Hirai, Tokyo, Japan

[73] Assignee: NEC Corporation, Tokyo, Japan

[21] Appl. No.: 09/210,673

[22] Filed: Dec. 14, 1998

[30] Foreign Application Priority Data

Dec. 15, 1997 [JP] Japan ..................................... 9-344570

[51] Int. Cl.$^7$ .......................... H01L 23/48; H01L 23/52; H01L 29/40
[52] U.S. Cl. ........................... 257/786; 257/773; 438/129
[58] Field of Search ..................................... 257/773, 786, 257/372, 448, 483, 484, 909, 202, 203, 210; 438/612, 666, 618, 129

[56] References Cited

U.S. PATENT DOCUMENTS

| | | | |
|---|---|---|---|
| 5,206,529 | 4/1993 | Mine | 257/202 |
| 5,304,826 | 4/1994 | Ichikawa et al. | 257/202 |
| 5,466,956 | 11/1995 | Aeba | 257/203 |
| 5,665,996 | 9/1997 | Williams et al. | 257/401 |
| 5,814,893 | 9/1998 | Hsu et al. | 257/784 |
| 5,869,870 | 2/1999 | Lin | 257/355 |
| 5,869,900 | 2/1999 | Crafts | 257/758 |

FOREIGN PATENT DOCUMENTS

| | | |
|---|---|---|
| 4-171844 | 6/1992 | Japan . |
| 4-256338 | 9/1992 | Japan . |

*Primary Examiner*—David Hardy
*Assistant Examiner*—Jhihan B Clark
*Attorney, Agent, or Firm*—Sughrue, Mion, Zinn, Macpeak & Seas, PLLC

[57] ABSTRACT

A pad block is provided with a pad, an output buffer circuit and an internal circuit. The region between the internal circuit and the output buffer circuit serves as an element arrangement forbidden region. In this region, the internal circuit and the output buffer circuit are connected to each other by, for example, a polysilicon layer. The internal circuit is connected to a circuit formed in an internal region of a chip by using at least two wiring layers passing the element arrangement forbidden region. By laying out the wiring connecting the internal circuit within the pad block to the circuit in the internal region of the chip in the element arrangement forbidden region provided within the pad block, it is possible to reduce a space necessary for wiring and thereby to realize a highly integrated device.

17 Claims, 9 Drawing Sheets

SEMICONDUCTOR INTEGRATED CIRCUIT AND LAYOUT METHOD THEREOF

BACKGROUND OF THE INVENTION

1. Field of the Invention

The present invention relates to a semiconductor integrated circuit and a layout method thereof and relates to, in particular, a semiconductor integrated circuit wherein pad block macros are arranged on peripheral portions of a chip and hardware macros and standard cells are arranged inside the chip using an automatic layout and wiring program, and to a layout method thereof.

2. Description of the Related Art

An automatic layout method using a standard cell having a standardized height has been mainly used for the layout of a semiconductor integrated circuit device referred to as an ASIC in recent years. Due to packaging standards, measures against, for example, latch-up destruction, electrostatic destruction and noise, the layout of input terminals, output terminals and input/output terminals and peripheral elements relating to them is given more limitations than the layout of internal chips. For that reason, there are many cases where input and output terminals are formed into hardware macros as pad blocks.

FIG. 1 is a plan view showing an example of a semiconductor integrated circuit device arranged using the above-stated pad blocks. Chip regions are roughly divided into two parts; a pad region 401 in which pad blocks are arranged and an internal region 402 in which other circuits are arranged. In the internal region 402, there are arranged hardware macros 403 such as a ROM, a RAM and an A/D converter, and a standard cell 404. Input and output wirings (not shown) are arranged between the layout of the internal region 402 and pad blocks 405, respectively.

The interior of the pad block 405 is arranged as shown in, for example, FIG. 2. A reference numeral 501 denotes a pad for wire bonding, a reference numeral 502 denotes an output buffer/protecting circuit having an electrostatic destruction protecting function, a reference numeral 503 denotes a wiring for connecting the pad 501 to the output buffer/protecting circuit 502. A reference numeral 504 denotes a guard ring for preventing latch-up, a reference numeral 505 denotes an internal circuit for driving the output buffer/protecting circuit 502 and a reference numeral 506 denotes a wiring for connecting the output buffer circuit to the internal circuit 505.

FIG. 3 shows another example of the layout of a pad block. This exemplifies a case where an internal circuit is separated from the pad block. A reference numeral 601 denotes a bonding pad, a reference numeral 602 denotes an output buffer/protecting circuit, reference numeral 603 denotes a wiring for connecting the pad 601 to the output buffer, a reference numeral 604 denotes a guard ring for preventing latch-up, and a reference numeral 605 denotes an arrangement forbidden region in which the layout of elements and other blocks are forbidden.

Now, the reason for providing the arrangement forbidden region 605 in hard macros shown in FIG. 3 will be described. The internal circuit needs to be arranged to have predetermined distances from the guard ring and the buffer circuit provided within the pad block for preventing latch-up. In the example of FIG. 2, part of the internal circuit is incorporated into the pad block and a certain distance is maintained between the output buffer circuit and the internal circuit. Due to this, there is no need to consider this distance when arranging integrated circuit chips. In the example of FIG. 3, on the other hand, where the internal circuit is separated from the pad block, it is required to maintain distances for preventing latch-up no matter which block is adjacent to the pad block. It is, therefore, necessary to provide a forbidden region in advance so as not to arrange the internal circuit block.

The integrated circuit chips are arranged by procedures as shown in the flow chart of FIG. 4, after preparing necessary pad blocks, hardware macros and a standard cell. First, in step S1, pad optimum position coordinates are calculated from an anticipated chip size and a package to be used. Pad blocks are then arranged on the optimum position coordinates in step S2. Hardware macros are arranged in the internal region in step S3. After special wirings such as a power supply are wired in step S4, an automatic arrangement wiring is then executed on the overall chips in step S5. As wirings, pre-defined wiring layers, such as the first wiring layer in X direction and the second wiring layer in Y direction, are used.

FIG. 5 is a layout diagram showing a wiring state in which the internal region 802 is connected to pad blocks 801 shown in FIG. 2. Also, as shown in the figure, each of the pad blocks 801 comprises a guard ring 803. As shown therein, ports from which wirings are taken out from the internal region 802 and those from which wirings are incorporated into the internal region 802 are not necessarily provided adjacent to the corresponding pad blocks. In case of employing inexpensive chips, in particular, wiring layers are limited to two layers or the like to hold down production costs. Due to this, wirings are allowed to pass through only limited portions of the internal region and ports for taking out wirings from pad blocs and those for incorporating them into the pad blocks are sometimes provided rather distant away from the corresponding pad blocks. As a result, as shown in FIG. 5, it is necessary to provide a region for detouring wirings 805 between the internal region 802 and the pad blocks 801. In addition, the wirings 805 are connected via through holes 804. In circumstances where integrated circuits are becoming smaller in size and so is the inner layout, an area used for arranging wirings around pads has a great influence on the chip size. Considering this, it is of importance to efficiently arrange peripheral portions of pad blocks and the detoured circuit wiring region, shown in FIG. 5, greatly causes a reduction in chip area.

FIG. 6 shows another example of a layout when the pad blocks shown in FIG. 3 are used. Each of the pad blocks 901 is provided with an arrangement forbidden region 904 with a guard ring 903. An internal circuit 905 is arranged inside the pad block 901. The internal circuit 905 is connected to the circuit of the internal region 902 via a wiring and a through hole.

The pad block of such a type as shown in FIG. 3 is arranged to be separated from the internal circuit. Due to this, to arrange integrated circuit chips, the pad blocks and internal circuit blocks should be arranged in pairs. As shown in FIG. 6, therefore, the layout forbidden region 904 between an internal circuit block and the guard ring 903 of a pad block can be used for wiring. In this method, however, not only a wiring region needs to provided be between the internal circuit 905 and the internal region 902 and but also the number of steps increases since a step for arranging internal circuit blocks needs to be added to a step for arranged pad blocks.

SUMMARY OF THE INVENTION

It is, therefore, an object of the present invention to provide a semiconductor integrated circuit device and a layout method thereof capable of avoiding cumbersomeness resulting from providing an element arrangement forbidden region during layout process, by using a pad block provided with an element arrangement forbidden region having an internal circuit incorporated thereinto in advance and capable of reducing a chip area by reducing a wiring region.

The object of the present invention can be attained by using pad blocks, which fail to employ at least two wiring layers among all the wirings for internal wiring in the arrangement forbidden region in which the arrangement of elements is forbidden to prevent latch-up and by arranging wirings for connecting pad block internal circuits to an internal region in the above-stated element forbidden region during layout process.

Specifically, a semiconductor integrated circuit device according to the present invention comprises: an internal region of a chip where circuits are provided; one or a plurality of pad blocks provided at a peripheral portion of the chip. Each of said pad blocks includes: an input/output pad; a peripheral circuit including a protecting circuit; an internal circuit; an element arrangement forbidden region arranged between said peripheral circuit and said internal circuit, arrangement of elements being forbidden in said element arrangement forbidden region; and an inner block wiring provided in said element arrangement forbidden region, for connecting said peripheral circuit to said internal circuit. At least two wiring layers connects the internal circuit of at least a part of said pad blocks to a circuit of said internal region and said wiring layers pass through the element arrangement forbidden region provided within said pad block.

In addition, a semiconductor integrated circuit device layout method according to the present invention is a semiconductor integrated circuit layout method using an automatic layout and wiring program, the method characterized by comprising the steps of: laying out a pad block macro having an input/output pad, a peripheral circuit including a protecting circuit and an internal circuit provided on a peripheral portion of a chip and having an element arrangement forbidden region in which arrangement of elements is forbidden, the region provided between the peripheral circuit and the internal circuit, an inner block wiring provided in the element arrangement forbidden region connecting the peripheral circuit with the internal circuit; laying out an internal region circuit within a chip; and laying out wirings connecting the circuits, respectively, wherein the inner block wiring is provided without using at least two wiring layers among wirings used by the automatic arrangement and wiring program; and a wiring connecting at least a part of the internal circuit within the pad block macro with the internal region circuit is laid out within the element arrangement forbidden region provided in the pad block macro by the automatic layout and wiring program.

In the present invention, there exists an region in which elements cannot be provided to prevent latch-up. In the region, a pad block having at least two wiring layers which are not employed for inner block wiring is used. When an automatic layout/wiring program for integrated circuit chips is executed, the yet-to-be-used wiring layers can be freely used. Due to this, wherever pad blocks are arranged, the program can be executed and necessary wirings can be arranged by using the above-stated region within the pad blocks. According to the present invention, therefore, it is possible to avoid a situation in which a wasteful region has to be provided for wiring around pad blocks and to realize a semiconductor integrated circuit device such as ASIC with chips of smaller areas.

DESCRIPTION OF THE PREFERRED EMBODIMENTS

Figure 7:
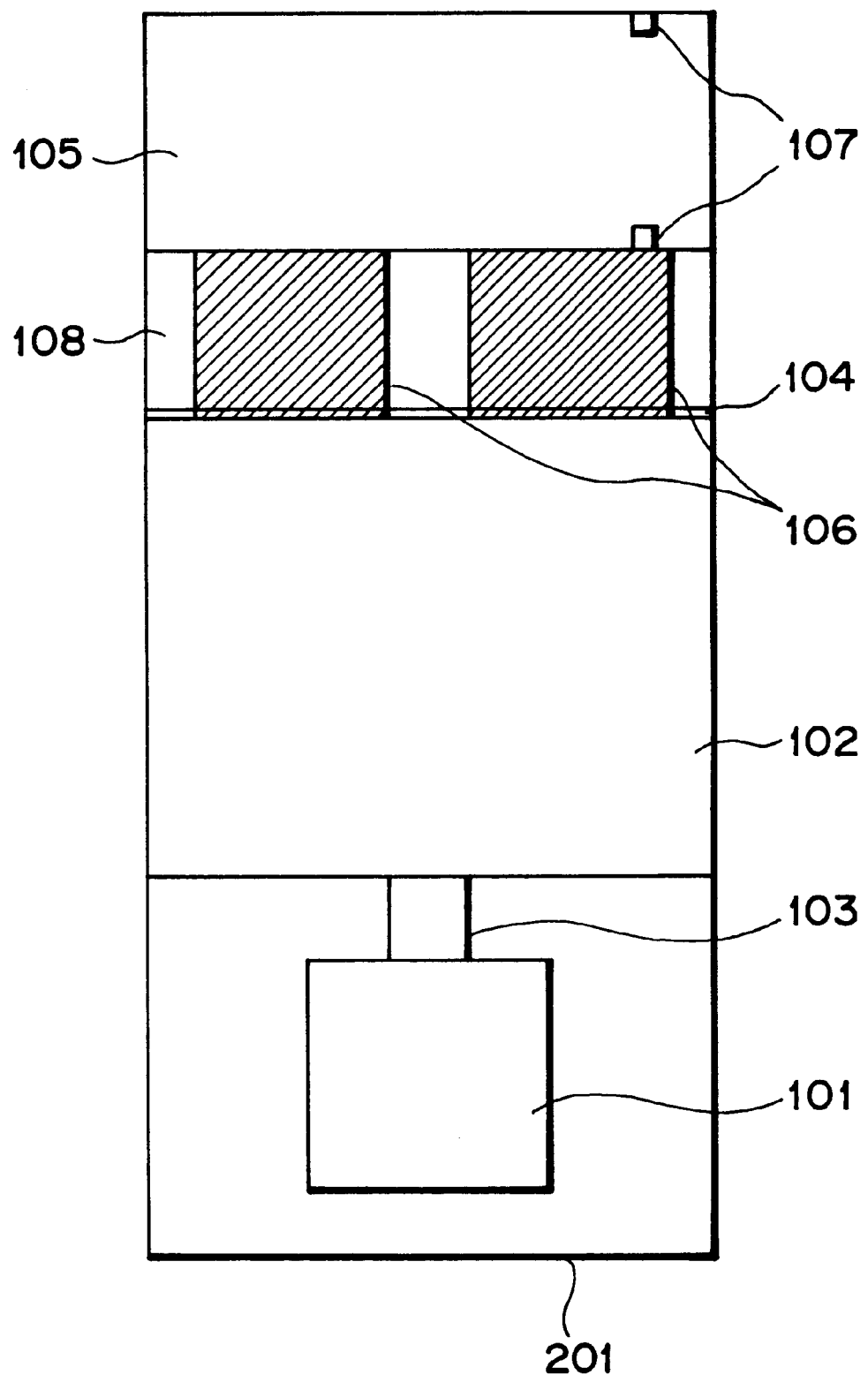
FIG. 7 shows a layout diagram of a pad block used in a layout method in the first embodiment according to the present invention.
Figure 8:
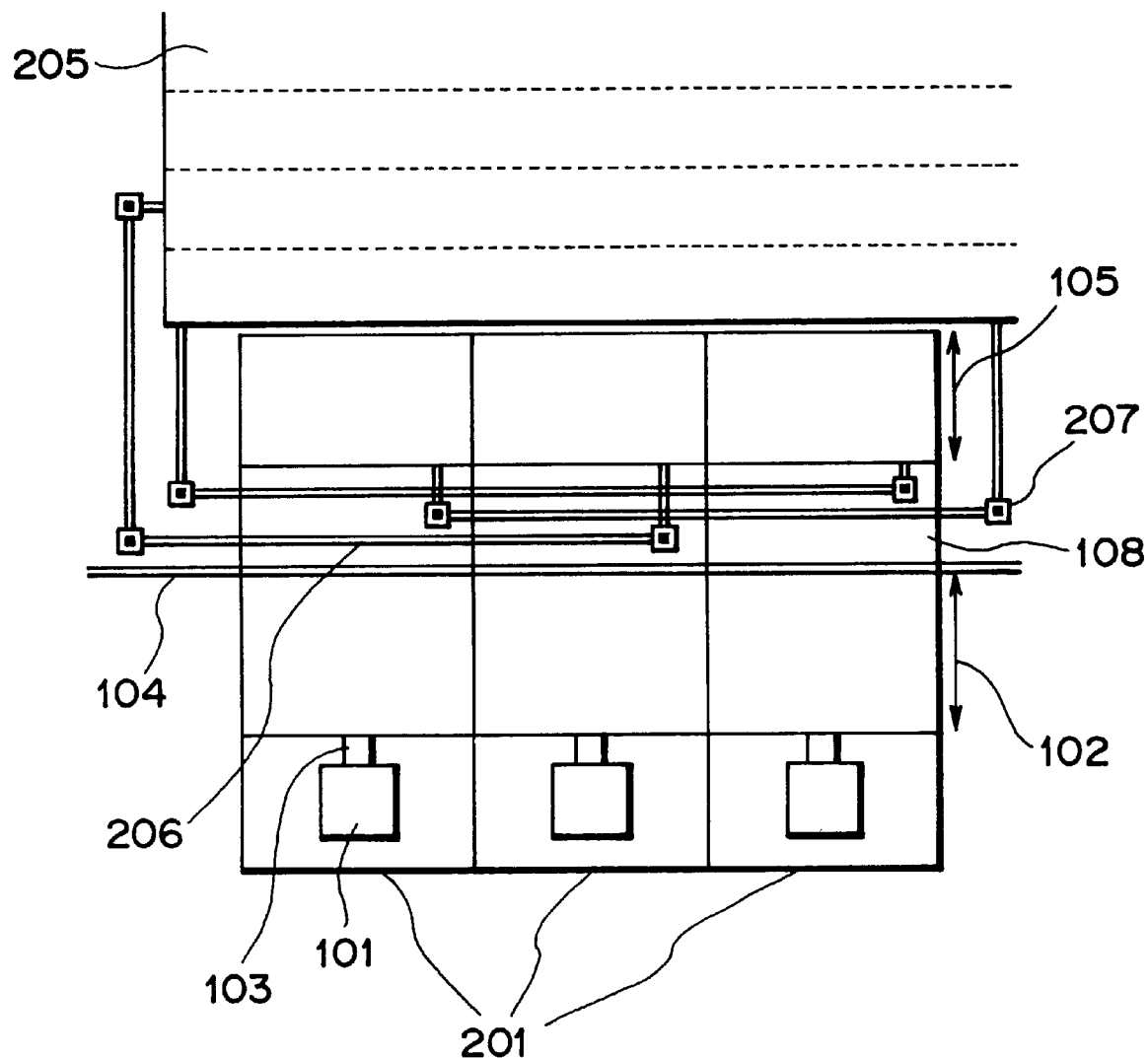
FIG. 8 shows a layout diagram of a chip arranged by the layout method in the first embodiment according to the present invention.

Preferred embodiments of the present invention will now be described specifically with reference to the accompanying drawings. FIG. 7 is a diagram showing a pad block of a semiconductor integrated circuit device in the first embodiment according to the present invention. FIG. 8 is a diagram showing a chip arranged by the layout method in the first embodiment according to the present invention. Prior to carrying out the first embodiment, two conductive layers; i.e., the first layer A1 and the second layer A1 are used as wiring layers in an automatic chip layout/wiring program.

The constitution inside a pad block 201 shown in FIG. 7 will be described. The pad block 201 is arranged on the peripheral portion of a chip and an internal region 205 is provided inside the chip. In each of these pad blocks 201, an internal circuit 105 is provided on the internal region 205 side and an element arrangement forbidden region 108 is provided outside of the internal region 205. An output buffer/protecting circuit 102 having an electrostatic failure protecting function is arranged outside of the region 108 and a pad 101 for wire bonding is arranged outside of the circuit 102. Reference numeral 103 denotes a wiring for connecting the pad 101 with the output buffer circuit 102 and reference numeral 104 denotes a guard ring for preventing latch-up.

In this embodiment, a polysilicon layer 106 is formed to connect the output buffer circuit 102 with the internal circuit 105 in the element layout forbidden region 108. Between the output buffer/protecting circuit 102 and the internal circuit 105, the region 108 in which the arrangement of transistors and the like employing diffused layers is forbidden is provided. In this embodiment, this region 108 is used for the polysilicon layer for connecting circuits within the block. The disadvantage in that polysilicon has high resistance can be compensated by making the width of the polysilicon layer larger. As a result, both the first layer A1 and the second layer A1 serving as wiring layers are not used between the output buffer circuit 102 and the internal circuit 105.

A terminal 107 is provided to connect a wiring connecting to the internal circuit 105 of the pad block from a circuit of the internal region 205 of the chip. That is to say, the wiring from the internal circuit 105 is designed such that it can be taken out to the internal region of the chip and to the external region of the chip.

Figure 4:
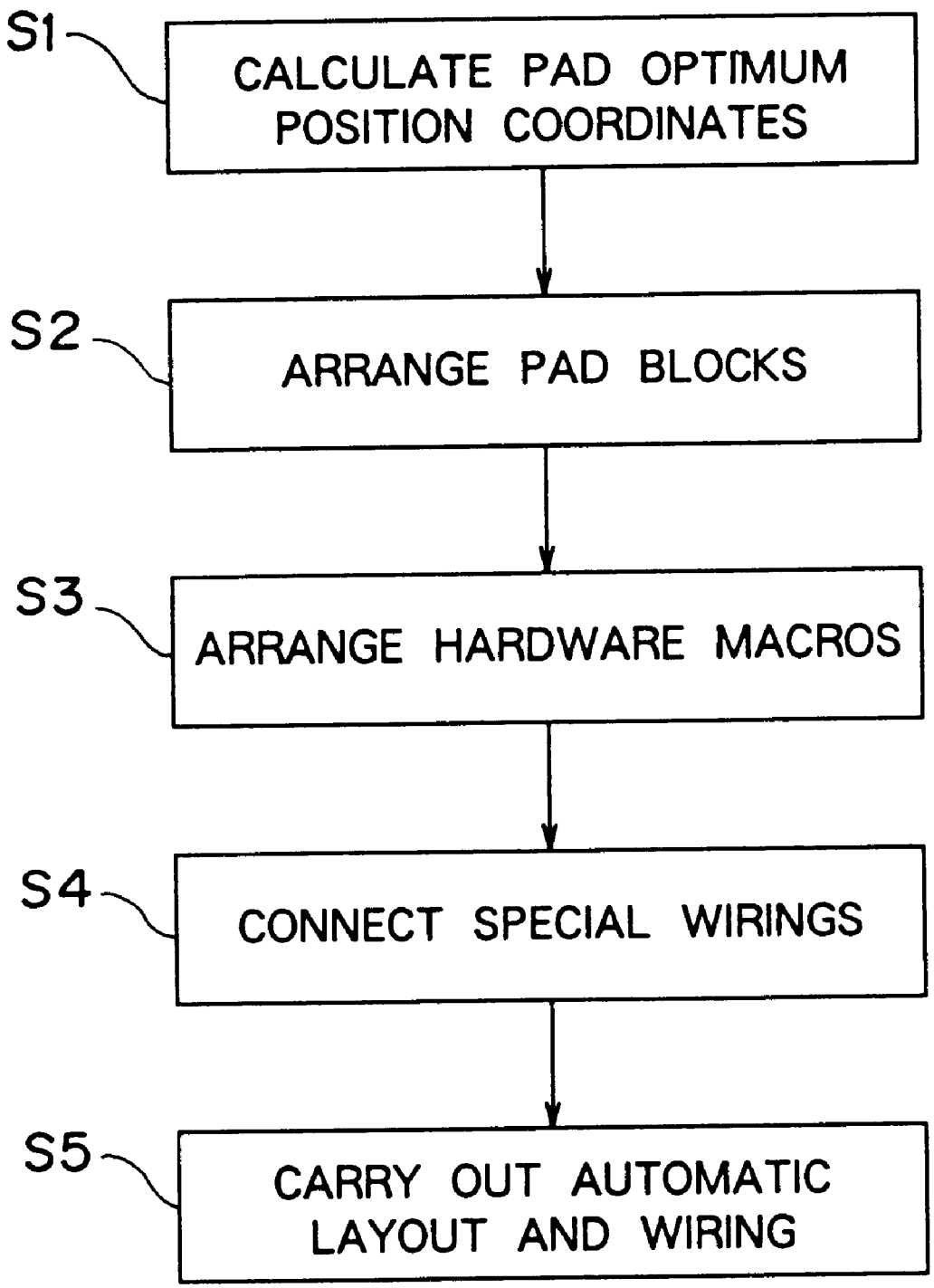
FIG. 4 is a flow chart for describing procedures of laying out of a chip.
Figure 5:
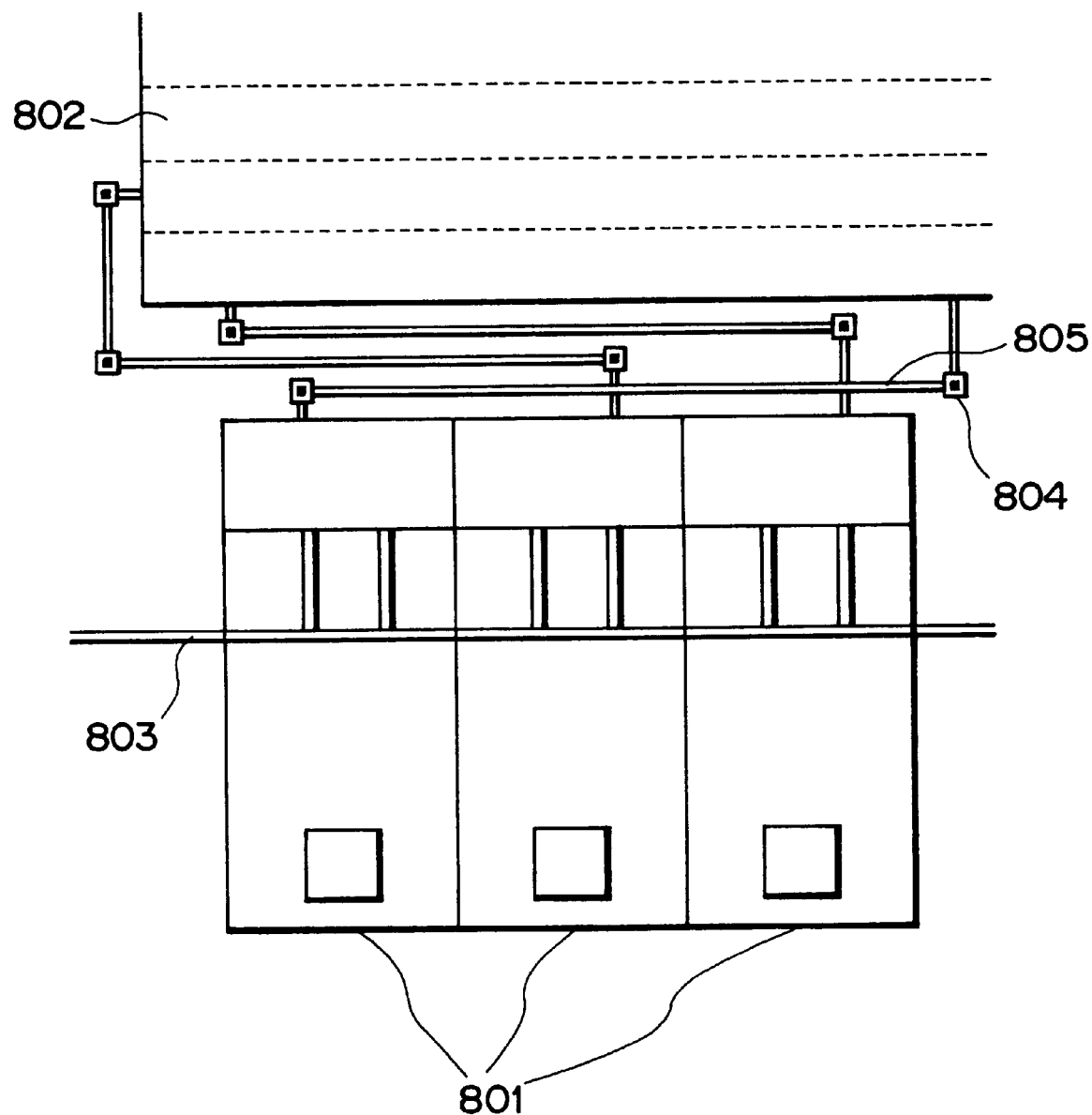
FIG. 5 shows a layout diagram of a chip for describing disadvantages of the conventional case.
Figure 6:
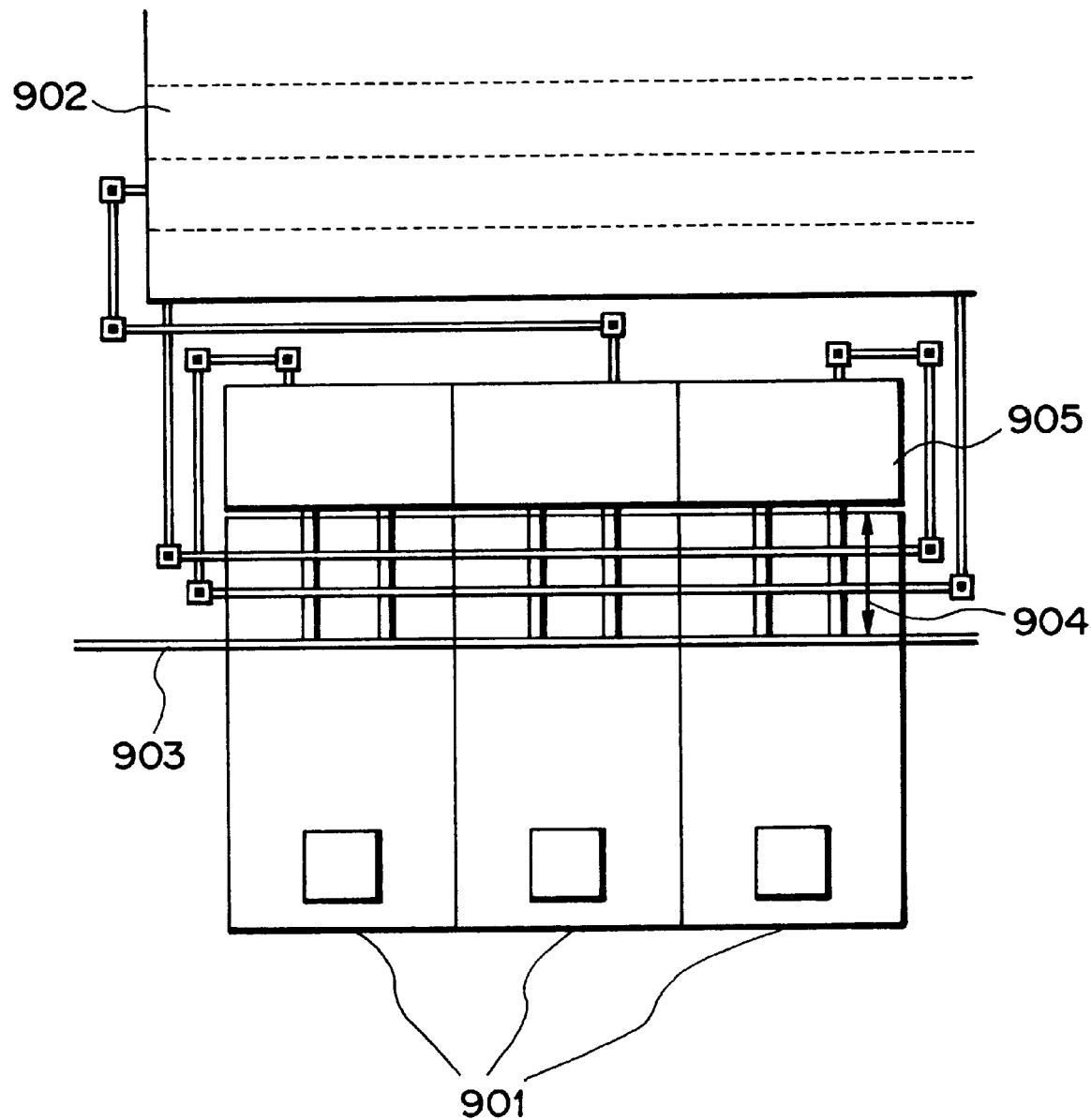
FIG. 6 shows a layout diagram of a chip for describing disadvantages of the conventional case.

Next, description will be given to an integrated circuit chip layout method using the pad block 201 of FIG. 7. The layout of a chip is carried out by procedures of the flow chart shown in FIG. 4, after preparing necessary pad blocks, hardware macros and a standard cell in advance. In step S1, pad optimum position coordinates are calculated from an anticipated chip size and a package to be used. In step S2, pad blocks are arranged on the optimum position coordinates. In step S3, hardware macros are arranged in the internal region. In step S4, special wirings such as a power supply are connected. Thereafter, in step S5, automatic layout/wiring program is executed to the entire chip.

Figure 1:
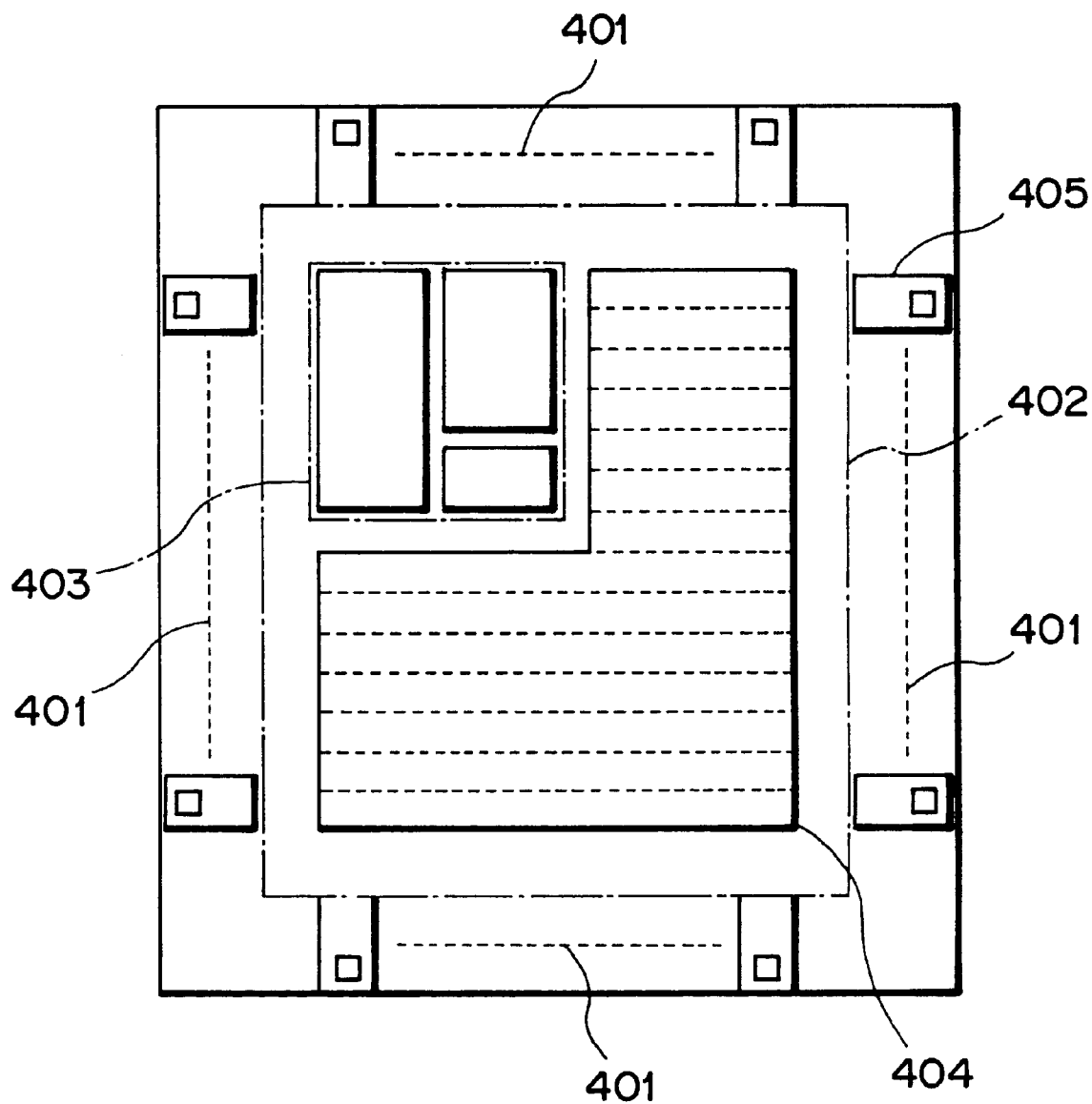
FIG. 1 shows a layout diagram of one chip for describing a conventional layout method.

Wiring around the pad blocks after executing the automatic arrangement/wiring program is as shown in FIG. 8. In FIG. 8, one line of wirings is connected to each of the three pad blocks from the circuit portion of the internal region of the chip. The first layer A1 and the second layer A1 are used for the wirings 206 in X direction (horizontal direction in FIG. 8) and Y direction (vertical direction in FIG. 8), respectively. The first layer A1 and the second layer A1 are connected to each other by a through hole 207. In the pad block 201 used in this layout method, the first layer A1 and the second layer A1 serving as wiring layers between the internal circuit 105, and the output buffer/protecting circuit 102 as shown in FIG. 1 are not used. This makes it possible to freely use this region for chip wiring in the automatic wiring program used for chip layout process.

It is also possible to establish connection to the circuit of the internal region 205 of the chip using terminals inside the internal circuit 105 (closer to the internal region 205 side) among the terminals 107 provided at the internal circuit 105. Only the terminals 107 on the internal region 205 side may be used and all of the terminals 107 may be used. To arrange wirings if the terminals on the internal region 205 side are used, it is preferable that a wiring region for allowing one wiring in X direction between the pad block 201 and the internal circuit 105. Even if a wiring region is provided in this manner, it is possible to reduce an area used only for the wiring region compared to the conventional case and therefore to realize highly integrated chips.

Figure 9:
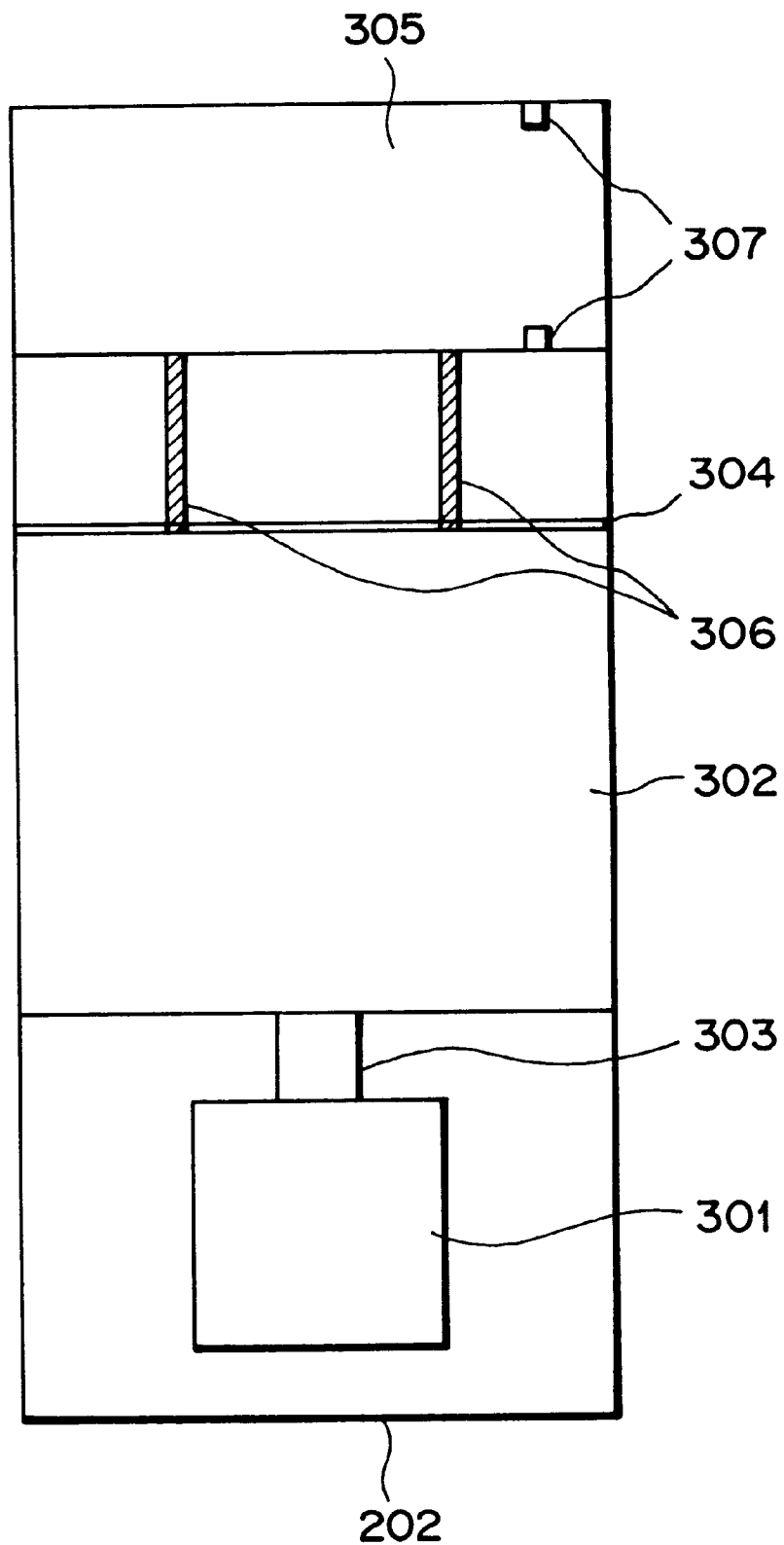
FIG. 9 shows a layout diagram of a pad block used in a layout method in the second embodiment according to the present invention.

FIG. 9 shows a layout of a pad block 202 used in a semiconductor integrated circuit device in the second embodiment according to the present invention. Prior to carrying out this embodiment, three conductive layers; i.e., the first layer A1, the second layer A1 and the third layer A1 are used as wiring layers in a chip automatic layout/wiring program. Wiring around pad blocks after executing the automatic layout/wiring program is the same as in the first embodiment shown in FIG. 8.

The constitution inside the pad block shown in FIG. 9 will be described. A reference numeral 301 denotes a pad for bonding, a reference numeral 302 denotes an output buffer/ protecting circuit, a reference numeral 303 denotes a wiring for connecting the pad to the output buffer circuit, a reference numeral 304 denotes a guard ring for preventing latch-up and a reference numeral 305 denotes an internal circuit. Reference numeral 306 denotes the first layer A1 for connecting the output buffer 302 with the internal circuit 305. The region between the output buffer/protecting circuit 302 and the internal circuit 305 are one in which elements such as transistors employing diffused layers cannot be arranged to prevent latch-up. In this embodiment, the first layer A1 in the region is used to connect the output buffer circuit with the internal circuit 305.

As a result, neither the second layer A1 and the third layer A1 among the wiring layers of the automatic layout/wiring program is used between the output buffer/protecting circuit 302 and the internal circuit 305. It is, therefore, possible for the automatic layout wiring program to arrange necessary wirings while using the second layer A1 and the third layer A2 in this region. It is noted that a terminal 307 is provided to connect a wiring connecting to the internal circuit 305 of the pad block from the circuit of the inside the chip.

Figure 2:
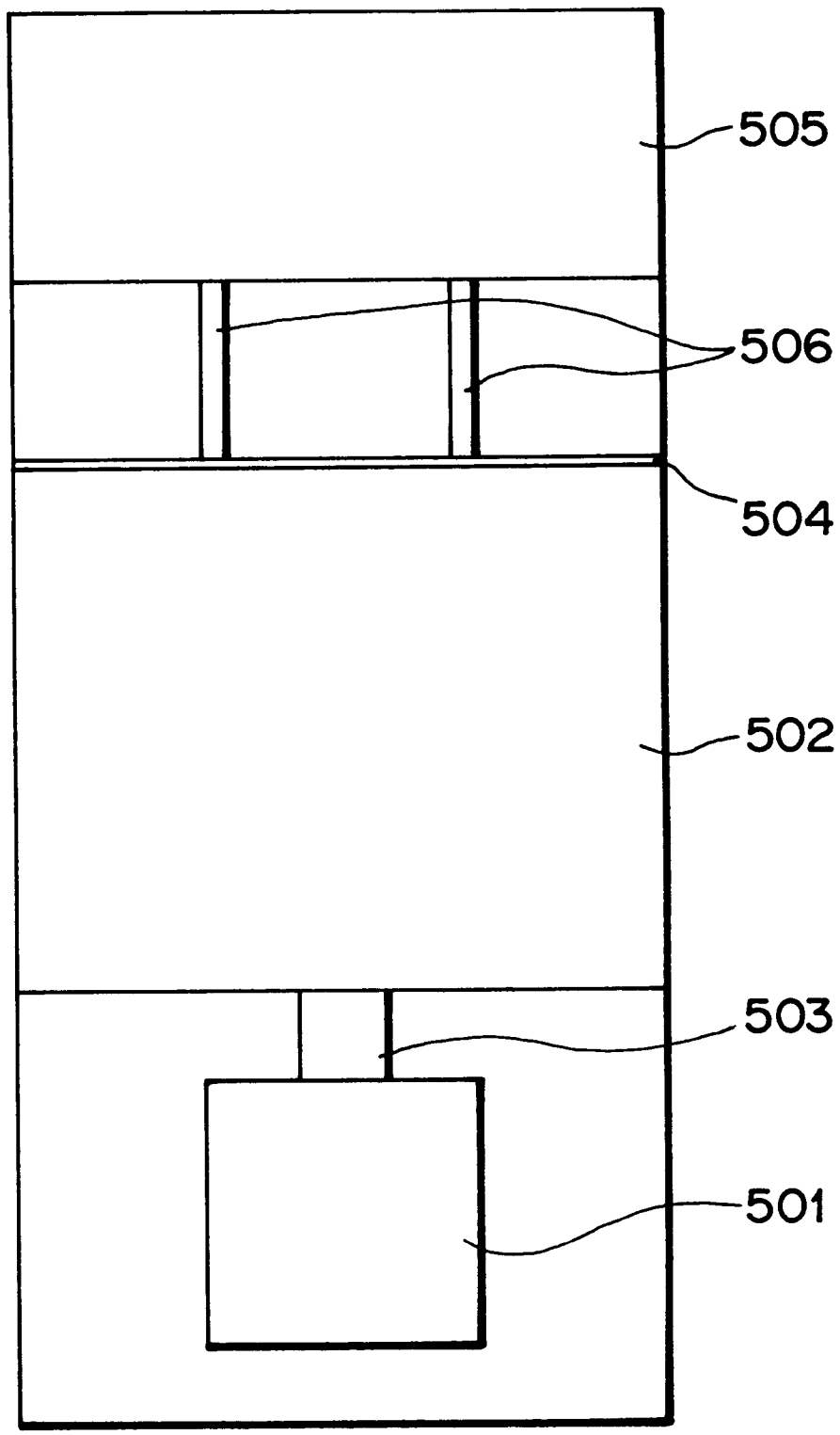
FIG. 2 shows a layout diagram of a pad block used in the conventional layout method.
Figure 3:
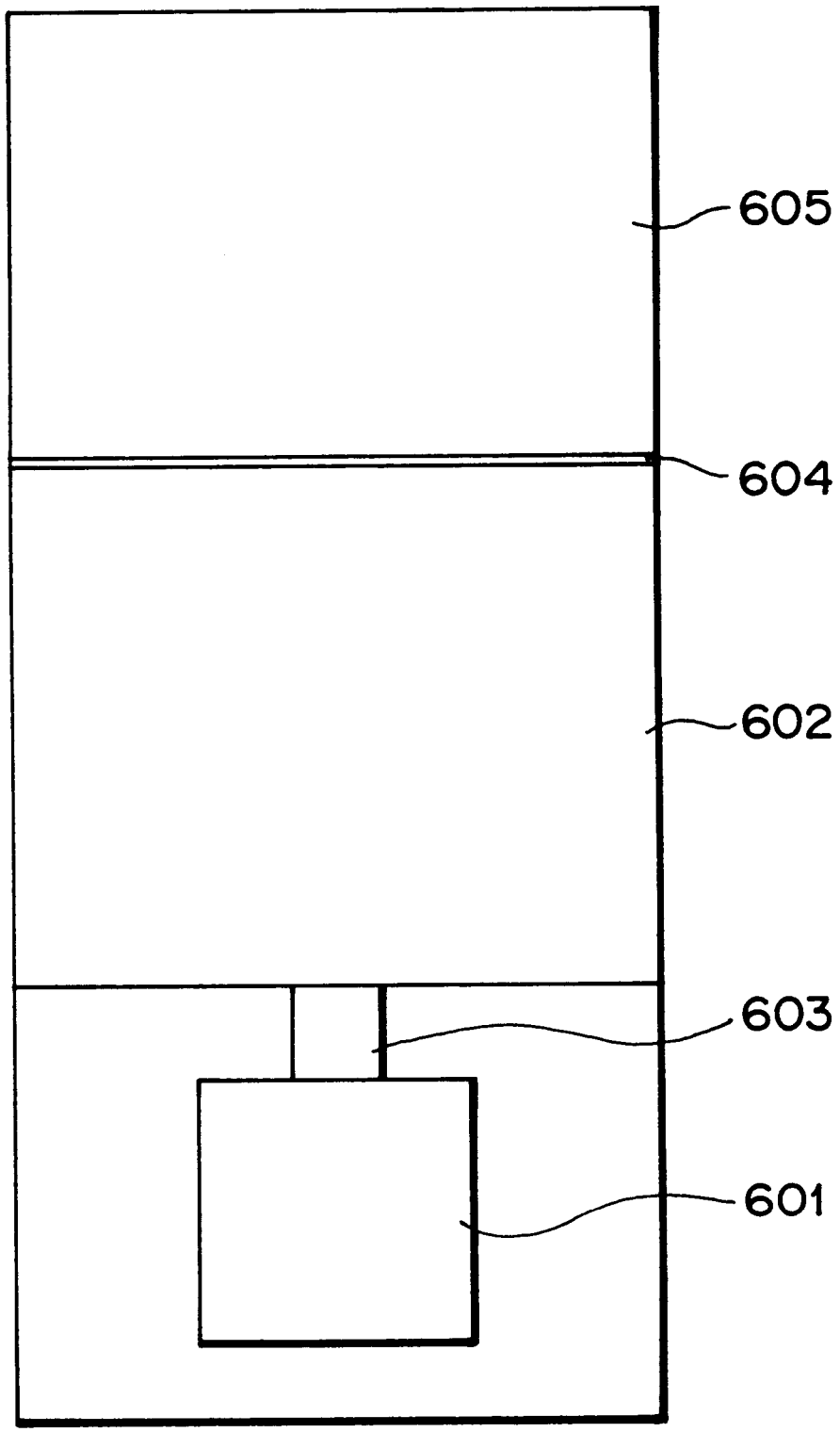
FIG. 3 shows a layout diagram of a pad block used in the conventional layout method.

By executing the automatic layout program for integrated circuit chips using the pad blocks shown in FIG. 9, wiring around pad blocks is as shown in FIG. 2 as in the case of the first embodiment.

The second embodiment is characterized in that, since the first layer A1 lower than polysilicon in resistance is used as a wiring layer for connecting the output buffer/protecting circuit 302 with the internal circuit 305, the width of a wiring can be made smaller and more wirings can be provided accordingly.

What is claimed is:

1. A semiconductor integrated circuit device comprising:
   an internal region of a chip where circuits are provided;
   one or a plurality of pad blocks provided at a peripheral portion of the chip, each of said pad blocks including:
      an input/output pad;
      a peripheral circuit including a protecting circuit;
      an internal circuit;
      an element arrangement forbidden region arranged between said peripheral circuit and said internal circuit, arrangement of elements being forbidden in said element arrangement forbidden region; and
      an inner block wiring provided in said element arrangement forbidden region, for connecting said peripheral circuit to said internal circuit; and
   at least two wiring layers connecting the internal circuit of at least a part of said pad blocks to a circuit of said internal region and passing through the element arrangement forbidden region provided within said pad block.

2. A semiconductor integrated circuit device according to claim 1, wherein the circuit of said internal region has a block designed according to a standard cell system or a block arranged as a hardware macro and a block designed according to the standard cell system.

3. A semiconductor integrated circuit device according to claim 1, wherein said inner block wiring is formed of a polysilicon layer, and said wirings connecting said internal circuit with the circuit of said internal region are formed of a first layer A1 and a second layer A1.

4. A semiconductor integrated circuit device according to claim 1, wherein said inner block wiring is formed of a first layer A1 and said wirings connecting said internal circuit with the circuit of said internal region are formed of a second layer A1 and a third layer A1.

5. A semiconductor integrated circuit layout method using an automatic layout and wiring program, said method comprising the steps of:
   laying out a pad block macro having an input/output pad, a peripheral circuit including a protecting circuit and an internal circuit provided on a peripheral portion of a chip and having an element arrangement forbidden region in which arrangement of elements is forbidden, said region provided between the peripheral circuit and the internal circuit, an inner block wiring provided in the element arrangement forbidden region connecting the peripheral circuit with the internal circuit;

laying out an internal region circuit within a chip; and laying out wirings connecting the circuits, respectively, wherein said inner block wiring is provided without using at least two wiring layers among wirings used by said automatic arrangement and wiring program; and a wiring connecting at least a part of the internal circuit within said pad block macro with said internal region circuit is laid out within the element arrangement forbidden region provided in said pad block macro by said automatic layout and wiring program.

6. A semiconductor integrated circuit layout method according to claim 5, wherein terminals for wiring taking out ports are provided on a chip interior side and a chip external side of the internal circuit provided in said pad block macro.

7. A semiconductor integrated circuit device comprising:

an internal region containing internal region circuitry;

a peripheral region located between said internal region and an exterior of said semiconductor integrated circuit device;

a pad block located in said peripheral region, wherein said pad block comprises:

a pad;

a buffer circuit electrically coupled to said pad;

an internal pad circuit electrically coupled to said buffer circuit;

a forbidden region located between said buffer circuit and said internal pad circuit, wherein circuit elements are forbidden to be disposed in said forbidden region; and an inner block wiring located in said forbidden region, wherein said inner block wiring electrically couples said buffer circuit and said internal pad circuit; and at least a first wiring layer electrically coupling said internal region circuitry in said internal region and said internal pad circuit of said pad block, wherein said first wiring layer passes through said forbidden region located in said pad block.

8. The semiconductor integrated circuit as claimed in claim 7, wherein said at least a first wiring layer comprises first and second wiring layers electrically coupling said internal region circuitry in said internal region and said internal pad circuit of said pad block, wherein said first and second wiring layers pass through said forbidden region located in said pad block.

9. The semiconductor integrated circuit device according to claim 7, wherein the internal region circuitry comprises at least one of a block designed according to a standard cell system and a block arranged as a hardware macro.

10. The semiconductor integrated circuit device according to claim 7, wherein the internal region circuitry comprises:

a block designed according to a standard cell system; and a block arranged as a hardware macro.

11. The semiconductor integrated circuit device according to claim 8, wherein said inner block wiring is formed of a polysilicon layer.

12. The semiconductor integrated circuit device according to claim 8, wherein said inner block wiring is formed of a third wiring layer disposed in a layered arrangement with said first and second wiring layers.

13. A method for creating a semiconductor integrated circuit device, comprising:

(a) disposing a pad block macro in a peripheral region of said semiconductor integrated circuit device, wherein said pad block macro comprises:

a pad;

a buffer circuit electrically coupled to the pad;

an internal pad circuit;

an forbidden region disposed between said buffer circuit and said internal pad circuit, wherein circuit elements are forbidden to be disposed in said forbidden region; and an inner block wiring located in said forbidden region and electrically coupling said buffer circuit and said internal pad circuit;

(b) disposing an internal region circuit in an internal region of said semiconductor integrated circuit device; and (c) electrically coupling said internal pad circuit and said internal region circuit via at least one conductive wiring, wherein said at least one conductive wiring is located in said forbidden region.

14. The method as claimed in claim 13, wherein said steps (a) to (c) are performed by an automatic layout and wiring routine.

15. The method as claimed in claim 13, wherein said at least one conductive wiring comprises a first wiring layer and a second wiring layer, and wherein said internal pad circuit and said internal region circuit are electrically coupled via said first wiring layer and said second wiring layer, and wherein said first wiring layer and said second wiring layer are located in said forbidden region.

16. The method as claimed in claim 13, wherein said inner block wiring formed via a polysilicon layer.

17. The method as claimed in claim 15, wherein said inner block wiring is formed via a third wiring layer without using said first wiring layer and said second wiring layer.

* * * * *